(12) United States Patent
Shen et al.

(10) Patent No.: US 10,469,207 B2
(45) Date of Patent: Nov. 5, 2019

(54) POLAR CODE RETRANSMISSION METHOD AND APPARATUS

(71) Applicant: HUAWEI TECHNOLOGIES CO., LTD., Shenzhen, Guangdong (CN)

(72) Inventors: Hui Shen, Shenzhen (CN); Bin Li, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 32 days.

(21) Appl. No.: 15/270,411

(22) Filed: Sep. 20, 2016

(65) Prior Publication Data

US 2017/0012744 A1 Jan. 12, 2017

Related U.S. Application Data

(63) Continuation of application No. PCT/CN2014/073893, filed on Mar. 21, 2014.

(51) Int. Cl.
*H04L 1/18* (2006.01)
*H04L 1/00* (2006.01)
(Continued)

(52) U.S. Cl.
CPC .......... *H04L 1/1819* (2013.01); *H03M 13/13* (2013.01); *H03M 13/6306* (2013.01);
(Continued)

(58) Field of Classification Search
CPC ... H04L 1/1819; H04L 1/0057; H04L 1/0041; H04L 43/16; H04L 1/1896; H04L 1/1816;
(Continued)

(56) References Cited

U.S. PATENT DOCUMENTS

| 6,263,465 B1 | 7/2001 | Gehlot |
| 7,346,832 B2 | 3/2008 | Richardson et al. |
| (Continued) | | |

FOREIGN PATENT DOCUMENTS

| CN | 103220001 | 7/2013 |
| CN | 103281166 A | 9/2013 |
| (Continued) | | |

OTHER PUBLICATIONS

International Search Report, dated Nov. 14, 2014, in International Application No. PCT/CN2014/073893 (4 pp.).

(Continued)

*Primary Examiner* — Thien Nguyen
(74) *Attorney, Agent, or Firm* — Leydig, Voit & Mayer, Ltd.

(57) ABSTRACT

The present invention relates to the field of communications network technologies, and discloses a polar code retransmission method and apparatus, which can improve HARQ performance. In embodiments of the present invention, some information bits of a first polar code are encoded to obtain a second polar code, where the first polar code is a code word that is transmitted for the first time; modulo-2 addition is performed on the first polar code and the second polar code to obtain a third polar code; and the third polar code is sent as a to-be-retransmitted code word. The solutions provided in the embodiments of the present invention are applicable when a polar code is retransmitted.

15 Claims, 5 Drawing Sheets

(51) Int. Cl.
 *H04L 12/26* (2006.01)
 *H03M 13/13* (2006.01)
 *H03M 13/00* (2006.01)

(52) U.S. Cl.
 CPC .......... *H04L 1/0041* (2013.01); *H04L 1/0057* (2013.01); *H04L 1/1816* (2013.01); *H04L 1/1867* (2013.01); *H04L 1/1896* (2013.01); *H04L 43/16* (2013.01)

(58) Field of Classification Search
 CPC .. H04L 1/1867; H03M 13/6306; H03M 13/13
 See application file for complete search history.

(56) References Cited

U.S. PATENT DOCUMENTS

| | | | |
|---|---|---|---|
| 8,347,186 | B1 | 1/2013 | Arikan |
| 2008/0163027 | A1 | 7/2008 | Richardson et al. |
| 2008/0294959 | A1 | 11/2008 | Chindapol et al. |
| 2011/0280186 | A1* | 11/2011 | Rasquinha .......... H03M 13/275 370/328 |
| 2013/0091407 | A1* | 4/2013 | Cheng .................. H03M 13/23 714/790 |
| 2014/0019820 | A1 | 1/2014 | Vardy et al. |
| 2014/0365842 | A1 | 12/2014 | Li et al. |
| 2015/0026543 | A1 | 1/2015 | Li et al. |
| 2015/0103947 | A1 | 4/2015 | Shen et al. |
| 2015/0229337 | A1* | 8/2015 | Alhussien ............ H03M 13/35 714/773 |
| 2015/0295593 | A1 | 10/2015 | Trifonov et al. |
| 2016/0013810 | A1 | 1/2016 | Gross et al. |
| 2016/0182187 | A1 | 6/2016 | Kim et al. |

FOREIGN PATENT DOCUMENTS

| | | |
|---|---|---|
| CN | 103368583 A | 10/2013 |
| CN | 103516476 | 1/2014 |
| RU | 2395902 C2 | 7/2010 |
| RU | 2571587 C2 | 12/2015 |

OTHER PUBLICATIONS

Written Opinion of the International Searching Authority, dated Nov. 14, 2014, in International Application No. PCT/CN2014/073893 (6 pp.).
Extended European Search Report, dated Feb. 3, 2017, in European Application No. 14886655.1 (5 pp.).
Cadambe, V. et al., *Interference Alignment and Spatial Degrees of Freedom for the K User Interference Channel*, 2008 IEEE, pp. 971-975.
Arikan, E., *Channel polarization: A method for constructing capacity-achieving codes for symmetric binary-input memoryless channels*, Jul. 20, 2009, pp. 1-23.
Li, B. et al., *Theory and Application of Polar Code*, Communications Technology, vol. 45, No. 10, 2012, pp. 21-23.
Li, B. et al., *An Adaptive Successive Cancellation List Decoder for Polar Codes with Cyclic Redundancy Check*, IEEE Communications Letters, vol. 16, No. 12, Dec. 2012, pp. 2044-2047.
Tal, I., *List Decoding of Polar Codes*, IEEE Transactions on Information Theory, vol. 61, No. 5, May 2015, pp. 2213-2226.
International Search Report dated Nov. 14, 2014 in corresponding International Application No. PCT/CN2014/073893.
Russian Notice of Allowance dated Jun. 20, 2018 in corresponding Russian Patent Application No. 2017126736/08, 25 pgs.
Lin Liang, "Polar Codes Theory and Applications," Beijing University of Posts and Telecommunications, Dec. 2, 2012 (70 pp.).
Kai Chen et al., "A Hybrid ARQ Scheme Based on Polar Codes," IEEE Communications Letters, vol. 17, No. 10, Oct. 2013, pp. 1996-1999.
Office Action, dated Dec. 5, 2018, in Chinese Application No. 201480077305.0 (6 pp.).

* cited by examiner

POLAR CODE RETRANSMISSION METHOD AND APPARATUS

CROSS-REFERENCE TEMPLATES

This application is a continuation of International Application No. PCT/CN2014/073893, filed on Mar. 21, 2014, the disclosure of which is hereby incorporated by reference in its entirety.

TECHNICAL FIELD

The present invention relates to the field of communications technologies, and in particular, to a polar code retransmission method and apparatus.

BACKGROUND

In a communications system, channel coding is generally used to improve reliability of data transmission, so as to ensure communication quality. A polar code (Polar code) is a linear block code, and it has been theoretically proved that the polar code is an encoding manner that can achieve a Shannon capacity and has low coding-decoding complexity. An encoding output of the polar code may be expressed as follows:

$x_1^N = u_1^N G_N$, where $u_1 = \{u_1, u_2, \ldots, u_N\}$ is a binary row vector, and a length is N; and $G_N$ is a N*N matrix, $G_N = B_N F^{\otimes n}$, a code length N=2, and n≥0, where $$F = \begin{bmatrix} 1 & 0 \\ 1 & 1 \end{bmatrix},$$

$B_N$ is a transposed matrix, and $F^{\otimes n}$ is a Kronecker power and is defined as $F^{\otimes n} = F \otimes F^{\otimes (n-1)}$.

In an encoding process in which the polar code is used, some bits in $u_1^N$ are used to carry information, where these bits are referred to as information bits, and an index set of these bits is assumed as A. The other bits have fixed values, are referred to as frozen bits, and are generally set to 0. In this way, the encoding output of the polar code may be simplified as $x_1^N = u_A G_N(A)$, where $u_A$ is a set of information bits in $u_1^N$, $u_A$ is a row vector whose length is K, and K is a quantity of the information bits. $G_N(A)$ is a sub-matrix obtained by using rows corresponding to indexes in the set A, and $G_N(A)$ is a K*N matrix. Selection of the set A determines performance of the polar code.

In the prior art, a conventional chase combining Hybrid Automatic Repeat reQuest (HARQ) technology is used to perform encoding. In a case of a decoding failure, a receiving party stores received data and requires a sending party to retransmit the data.

SUMMARY

Embodiments of the present invention provide a polar code retransmission method and apparatus, which can improve HARQ performance.

According to a first aspect, an embodiment of the present invention provides a polar code retransmission method, including:

encoding some information bits of a first polar code to obtain a second polar code, where the first polar code is a code word that is transmitted for the first time;

performing modulo-2 addition on the first polar code and the second polar code to obtain a third polar code; and sending the third polar code as a to-be-retransmitted code word.

In a first possible embodiment, with reference to the first aspect, the encoding some information bits of a first polar code to obtain a second polar code includes:

determining a first information bit set $U_1$, where $U_1$ is a subset of an information bit set $U_2$ of the first polar code;

determining a first information bit index set $A_1$, where $A_1$ is an information bit index set of the second polar code; and encoding $U_1$ according to $A_1$ to obtain the second polar code, where both a code word length of the second polar code and a code word length of the first polar code are N/2, $N=2^n$, and n is an integer greater than 1.

In a second possible embodiment, with reference to the first aspect or the first possible embodiment of the first aspect, before the determining a first information bit set $U_1$, the method further includes:

determining a minimum code distance threshold $d_{th}$, where $d_{th}$ is greater than a minimum code distance $d_{cc}$ of an equivalent polar code whose code word length is N.

In a third possible embodiment, with reference to the first aspect or either of the foregoing possible embodiments of the first aspect, the method further includes:

determining a generator matrix G of the equivalent polar code whose code word length is N;

the determining a first information bit set $U_1$ includes:

determining a second information bit index set $A_2$ of the first polar code, where $A_2$ is an information bit index set of the first polar code; and determining a third information bit index set $A_3$, and determining that bits corresponding to m positions with row weights of G less than $d_{th}$ in $A_3$ are $U_1$, where $A_3 = A_2 + N/2$, and m is an integer greater than or equal to 1; and the determining a first information bit index set $A_1$ includes:

determining that sequence numbers of m rows with row weights of G greater than or equal to $d_{th}$ and with row sequence numbers less than N/2 form $A_1$.

In a fourth possible embodiment, with reference to the third possible embodiment of the first aspect, the determining that bits corresponding to m positions with row weights of G less than $d_{th}$ in $A_3$ are $U_1$ includes:

determining that bits corresponding to m positions with row weights of G less than $d_{th}$ and minimum in $A_3$ are $U_1$.

In a fifth possible embodiment, with reference to the third possible embodiment of the first aspect, the determining that sequence numbers of m rows with row weights of G greater than or equal to $d_{th}$ and with row sequence numbers less than N/2 form $A_1$ includes:

determining that sequence numbers of m rows with row weights of G greater than or equal to $d_{th}$ and maximum, and with row sequence numbers less than N/2 form $A_1$.

According to a second aspect, an embodiment of the present invention provides a polar code retransmission apparatus, including:

an encoding module, configured to encode some information bits of a first polar code to obtain a second polar code, and provide the second polar code for a modulo-2 addition module, where the first polar code is a code word that is transmitted for the first time;

the modulo-2 addition module, configured to perform modulo-2 addition on the first polar code and the second polar code to obtain a third polar code, and provide the third polar code for a sending module; and the sending module, configured to send the third polar code as a to-be-retransmitted code word.

In a first possible embodiment, with reference to the second aspect, the encoding module includes:

a determining unit, configured to determine a first information bit set $U_1$, and provide $U_1$ for an encoding unit, where $U_1$ is a subset of an information bit set $U_2$ of the first polar code, and the determining unit is further configured to determine a first information bit index set $A_1$, and provide $A_1$ for the encoding unit, where $A_1$ is an information bit index set of the second polar code; and the encoding unit, configured to encode $U_1$ according to $A_1$ to obtain the second polar code, where both a code word length of the second polar code and a code word length of the first polar code are $N/2$, $N=2^n$, and n is an integer greater than 1.

In a second possible embodiment, with reference to the second aspect or the first possible embodiment of the second aspect, the determining unit is further configured to determine a minimum code distance threshold $d_{th}$, where $d_{th}$ is greater than a minimum code distance $d_{cc}$ of an equivalent polar code whose code word length is N.

In a third possible embodiment, with reference to the second aspect or the second possible embodiment of the second aspect:

the determining unit is further configured to determine a generator matrix G of the equivalent polar code whose code word length is N; determine a second information bit index set $A_2$ of the first polar code, where $A_2$ is an information bit index set of the first polar code; determine a third information bit index set $A_3$, and determine that bits corresponding to m positions with row weights of G less than $d_{th}$ in $A_3$ are $U_1$, where $A_3=A_2+N/2$, and m is an integer greater than or equal to 1; and determine that sequence numbers of m rows with row weights of G greater than or equal to $d_{th}$ and with row sequence numbers less than N/2 form $A_1$.

In a fourth possible embodiment, with reference to the third possible embodiment of the second aspect, the determining unit is further configured to determine that bits corresponding to m positions with row weights of G less than $d_{th}$ and minimum in $A_3$ are $U_1$.

In a fifth possible embodiment, with reference to the third possible embodiment of the second aspect, the determining unit is further configured to determine that sequence numbers of m rows with row weights of G greater than or equal to $d_{th}$ and maximum, and with row sequence numbers less than N/2 form $A_1$.

According to a third aspect, an embodiment of the present invention provides a wireless communications apparatus, including:

a memory, configured to store an instruction for performing the following operations:

encoding some information bits of a first polar code to obtain a second polar code, where the first polar code is a code word that is transmitted for the first time; and performing modulo-2 addition on the first polar code and the second polar code to obtain a third polar code;

a processor, coupled with the memory and a transmitter, and configured to execute the instruction stored in the memory; and the transmitter, configured to send the third polar code as a to-be-retransmitted code word, where the third polar code is provided by the processor.

In a first possible embodiment, with reference to the third aspect, the memory is further configured to store an instruction for performing the following operations:

determining a first information bit set $U_1$, where $U_1$ is a subset of an information bit set $U_2$ of the first polar code; determining a first information bit index set $A_1$, where $A_1$ is an information bit index set of the second polar code; and encoding $U_1$ according to $A_1$ to obtain the second polar code, where both a code word length of the second polar code and a code word length of the first polar code are $N/2$, $N=2^n$, and n is an integer greater than 1.

In a second possible embodiment, with reference to the third aspect or the first possible embodiment of the third aspect, the memory is further configured to store an instruction for performing the following operation:

determining a minimum code distance threshold $d_{th}$, where $d_{th}$ is greater than a minimum code distance $d_{cc}$ of an equivalent polar code whose code word length is N.

In a third possible embodiment, with reference to the third aspect or either of the foregoing possible embodiments of the third aspect, the memory is further configured to store an instruction for performing the following operations:

determining a generator matrix G of the equivalent polar code whose code word length is N; determining a second information bit index set $A_2$ of the first polar code, where $A_2$ is an information bit index set of the first polar code; determining a third information bit index set $A_3$, and determining that bits corresponding to m positions with row weights of G less than $d_{th}$ in $A_3$ are $U_1$, where $A_3=A_2+N/2$, and m is an integer greater than or equal to 1; and determining that sequence numbers of m rows with row weights of G greater than or equal to $d_{th}$ and with row sequence numbers less than N/2 form $A_1$.

In a fourth possible embodiment, with reference to the third possible embodiment of the third aspect, the memory is further configured to store an instruction for performing the following operation:

determining that bits corresponding to m positions with row weights of G less than $d_{th}$ and minimum in $A_3$ are $U_1$.

In a fifth possible embodiment, with reference to the third possible embodiment of the third aspect, the memory is further configured to store an instruction for performing the following operation:

determining that sequence numbers of m rows with row weights of G greater than or equal to $d_{th}$ and maximum, and with row sequence numbers less than N/2 form $A_1$.

According to the polar code retransmission method and apparatus provided in the embodiments of the present invention, some information bits of a first polar code are encoded to obtain a second polar code, where the first polar code is a code word that is transmitted for the first time; modulo-2 addition is performed on the first polar code and the second polar code to obtain a third polar code; and the third polar code is sent as a to-be-retransmitted code word. Compared with a problem in the prior art that because a polar code that is transmitted for the second time is still a polar code that is transmitted for the first time, relatively low retransmission performance is caused, in the embodiments of the present invention, a first information bit set and a first information bit index set are determined by using a polar code that is transmitted for the first time, to obtain a second polar code, and modulo-2 addition is performed on the polar code that is transmitted for the first time and the second polar code to obtain a third polar code that is different from the polar code that is transmitted for the first time, so that retransmission performance can be improved.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
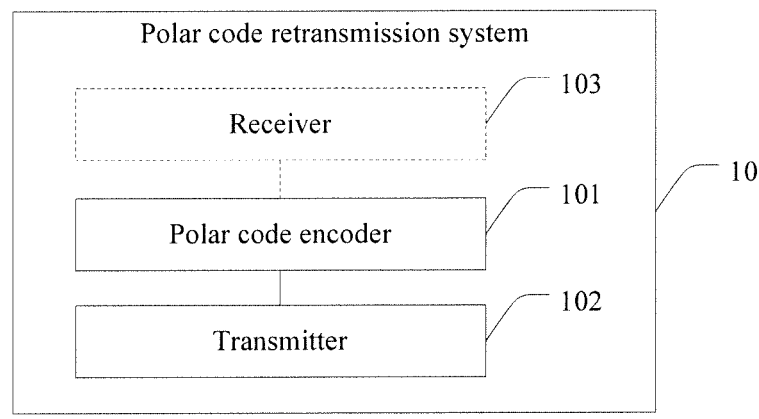
FIG. 1 is a schematic diagram of a system for executing, in a wireless communications environment, a polar code processing method in an implementation manner of the present invention.

Multiple embodiments are described with reference to the accompanying drawings, and same components in this specification are indicated by a same reference numeral. In the following description, for ease of explanation, many specific details are provided to facilitate a comprehensive understanding of one or more embodiments. However, apparently, the embodiments may also not be implemented by using these specific details. In other examples, a well-known structure and device are shown in a form of block diagrams, to conveniently describe one or more embodiments.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both a computing device and an application that runs on the computing device may be components. One or more components may reside within a process and/or a thread of execution, and a component may be located on one computer and/or distributed between two or more computers. In addition, these components may be executed from various computer-readable media that store various data structures. For example, the components may communicate by using a local and/or remote process and according to, for example, a signal having one or more data packets (for example, data from one component interacting with another component in a local system, a distributed system, and/or across a network such as the Internet interacting with other systems by using the signal).

In addition, the embodiments are described with reference to an access terminal. The access terminal may also be referred to as a system, a subscriber unit, a subscriber station, a mobile station, a remote station, a remote terminal, a mobile device, a user terminal, a terminal, a wireless communications device, a user agent, a user apparatus, or a UE (User Equipment, user equipment). The access terminal may be a cellular phone, a cordless phone, a SIP (Session Initiation Protocol, Session Initiation Protocol) phone, a WLL (Wireless Local Loop, wireless local loop) station, a PDA (Personal Digital Assistant, personal digital assistant), a handheld device having a wireless communication function, a computing device, or another processing device connected to a wireless modem. In addition, the embodiments are described with reference to a base station. The base station can be used to communicate with a mobile device; and the base station may be a BTS (Base Transceiver Station, base transceiver station) in GSM (Global System for Mobile Communications) or CDMA (Code Division Multiple Access, Code Division Multiple Access), or may be an NB (NodeB, NodeB) in WCDMA (Wideband Code Division Multiple Access, Wideband Code Division Multiple Access), or may further be an eNB or eNodeB (evolved NodeB) in LTE (Long Term Evolution, Long Term Evolution), a relay station or an access point, a base station device in a future 5G network, or the like.

In addition, aspects or features of the present invention may be implemented as a method, an apparatus or a product that uses standard programming and/or engineering technologies. The term "product" used in this application covers a computer program that can be accessed from any computer-readable component, carrier or medium. For example, the computer-readable medium may include but is not limited to: a magnetic storage component (for example, a hard disk, a floppy disk or a magnetic tape), an optical disc (for example, a CD (Compact Disk, compact disk), and a DVD (Digital Versatile Disk, digital versatile disk), a smart card and a flash memory component (for example, EPROM (Erasable Programmable Read-Only Memory, erasable programmable read-only memory), a card, a stick, or a key drive). In addition, various storage media described in this specification may indicate one or more devices and/or other machine-readable media that is used to store information. The term "machine-readable media" may include but is not limited to a radio channel, and various other media that can store, contain and/or carry an instruction and/or data.

As shown in FIG. 1, the present invention is applicable to a polar code retransmission system 10. The system 10 includes a polar code encoder 101 and a transmitter 102.

The polar code encoder 101 is configured to determine a first information bit set $U_1$, where $U_1$ is a subset of an information bit set $U_2$ of a first polar code, and the first polar code is a code word that is transmitted for the first time; determine a first information bit index set $A_1$, where $A_1$ is an information bit index set of a second polar code; encode $U_1$ according to $A_1$ to obtain the second polar code, where both a code word length of the second polar code and a code word length of the first polar code are N/2, $N=2^n$, and n is an integer greater than 1; and perform modulo-2 addition on the first polar code and the second polar code to obtain a third polar code as a to-be-retransmitted code word.

In addition, the transmitter 102 may subsequently transmit, on a channel, the third polar code obtained by means of processing by the polar code encoder 101. For example, the transmitter 102 may send related data to another different wireless communications apparatus (which is not shown).

Optionally, the wireless communications apparatus 10 further includes a receiver 103.

The receiver 103 is configured to obtain the first polar code, and then provide the first polar code for the polar code encoder 101.

Figure 2:
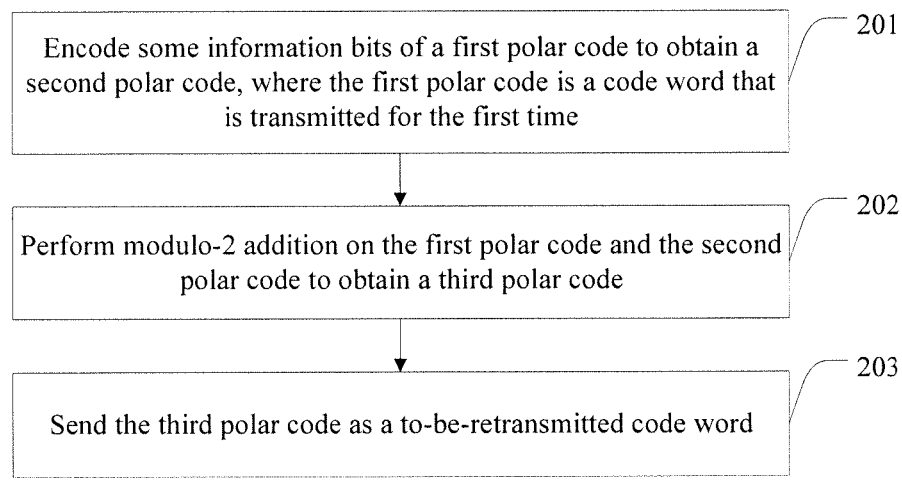
FIG. 2 is a flowchart of a polar code retransmission method according to an embodiment of the present invention.

FIG. 2 is a flowchart of a polar code retransmission method according to an embodiment of the present invention. The method in FIG. 2 may be executed by a polar code encoder in a polar code processing device and by a transmitter device.

201. Encode some information bits of a first polar code to obtain a second polar code, where the first polar code is a code word that is transmitted for the first time.

202. Perform modulo-2 addition on the first polar code and the second polar code to obtain a third polar code.

203. Send the third polar code as a to-be-retransmitted code word.

According to the foregoing solution, a first information bit set and a first information bit index set are determined by using a polar code that is transmitted for the first time, to obtain a second polar code, and modulo-2 addition is performed on the polar code that is transmitted for the first time and the second polar code to obtain a third polar code that is different from the polar code that is transmitted for the first time, so that HARQ performance can be improved, thereby ensuring reliability of data transmission.

Further, optionally, in step 201, that the polar code encoder encodes some information bits of the first polar code to obtain the second polar code includes:

determining, by the polar code encoder, a first information bit set $U_1$, where $U_1$ is a subset of an information bit set $U_2$ of the first polar code; determining a first information bit index set $A_1$, where $A_1$ is an information bit index set of the second polar code; and encoding $U_1$ according to $A_1$ to obtain the second polar code, where both a code word length of the second polar code and a code word length of the first polar code are N/2, $N=2^n$, and n is an integer greater than 1.

Optionally, before step 201, the method further includes: determining a minimum code distance threshold $d_{th}$ and determining a generator matrix G of an equivalent polar code whose code word length is N.

$d^{th}$ is greater than a minimum code distance $d_{cc}$ of the equivalent polar code whose code word length is N. Specifically, a polar code whose code word length is N/2 may be the first polar code or a default polar code.

A length of the first polar code is N/2 and a code rate of the first polar code is R, where R>0, $N=2^n$, n is an integer greater than 1, and n≥0. A polar code has a recursive structure. An equivalent polar code may be considered as two polar codes whose code lengths are N/2, which may be exemplarily shown in FIG. 3.

Optionally, in a possible implementation manner, the determining a first information bit set $U_1$ includes:

determining a second information bit index set $A_2$ of the first polar code, where $A_2$ is an information bit index set of the first polar code; and determining a third information bit index set $A_3$, and determining that bits corresponding to m positions with row weights of G less than $d_{th}$ in $A_3$ are $U_1$, where $A_3=A_2+N/2$, and m is an integer greater than or equal to 1.

It can be understood that G herein is a generator matrix of equivalent polar codes with a same code word length of N.

By using this embodiment of the present invention, a code distance of a polar code transmitted for the second time can be improved (that is, the code distance increases), thereby improving retransmission performance.

Figure 4:
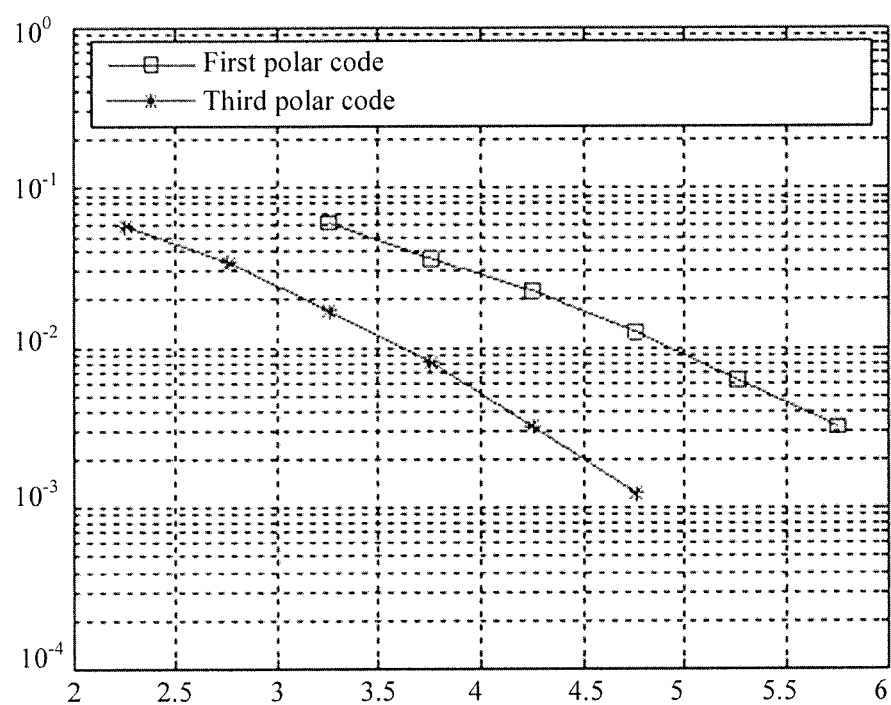
FIG. 4 is a schematic diagram showing an effect of a polar code retransmission method according to an embodiment of the present invention.

The following describes this embodiment of the present invention with reference to FIG. 4.

For the first polar code, a code rate is 12/16=3/4, a code length $N_1$ is 16, and an information bit length $K_1$ is 12. For the third polar code, a code rate is 12/32=3/8, a code length $N_2$ is 16, and an information bit length $K_2$ is 12. The first information bit set $U_1$ is {12}. The first information bit index set $A_1$ is {16}. An obtained minimum code distance of a conventionally retransmitted polar code is 4. However, an obtained minimum code distance of a retransmitted polar code (the third polar code) in the present invention is 8. As shown in FIG. 4, with this configuration and under a condition that a frame error rate (Frame Error Rate, FER) is $10^{-2}$, performance in this embodiment used in the present invention is improved by 1.2 dB compared with that in a conventional solution.

Figure 5:
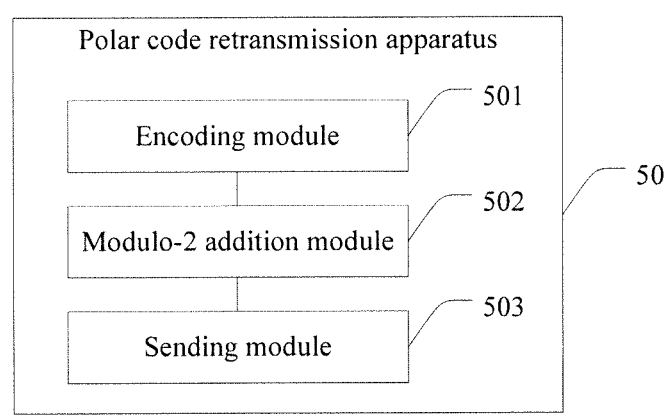
FIG. 5 is a schematic diagram of a logical structure of a polar code retransmission apparatus according to an embodiment of the present invention.

As shown in FIG. 5, the present invention provides a polar code retransmission apparatus 50. The apparatus 50 includes an encoding module 501, a modulo-2 addition module 502, and a sending module 503.

The encoding module 501 is configured to encode some information bits of a first polar code to obtain a second polar code, and provide the second polar code for the modulo-2 addition module 502, where the first polar code is a code word that is transmitted for the first time.

The modulo-2 addition module 502 is configured to perform modulo-2 addition on the first polar code and the second polar code to obtain a third polar code, and provide the third polar code for the sending module 503.

The sending module 503 is configured to send the third polar code as a to-be-retransmitted code word.

Figure 6:
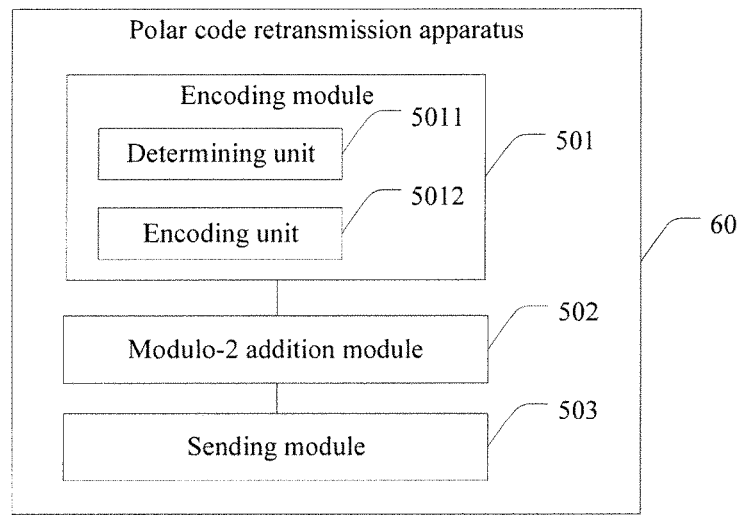
FIG. 6 is a schematic diagram of another logical structure of a polar code retransmission apparatus according to an embodiment of the present invention.

Optionally, in an embodiment, the present invention further provides a polar code retransmission apparatus 60. As shown in FIG. 6, an encoding module 501 in the apparatus 60 includes a determining unit 5011 and an encoding unit 5012.

Specifically, the determining unit 5011 is configured to determine a first information bit set $U_1$, and provide $U_1$ for the encoding unit 5012, where $U_1$ is a subset of an information bit set $U_2$ of a first polar code, and the first polar code is a code word that is transmitted for the first time.

The determining unit 5011 is further configured to determine a first information bit index set $A_1$, and provide $A_1$ for the encoding unit 5012, where $A_1$ is an information bit index set of a second polar code.

The encoding unit 5012 is configured to encode $U_1$ according to $A_1$ to obtain the second polar code, where both a code word length of the second polar code and a code word length of the first polar code are N/2, $N=2^n$, and n is an integer greater than 1.

Figure 3:
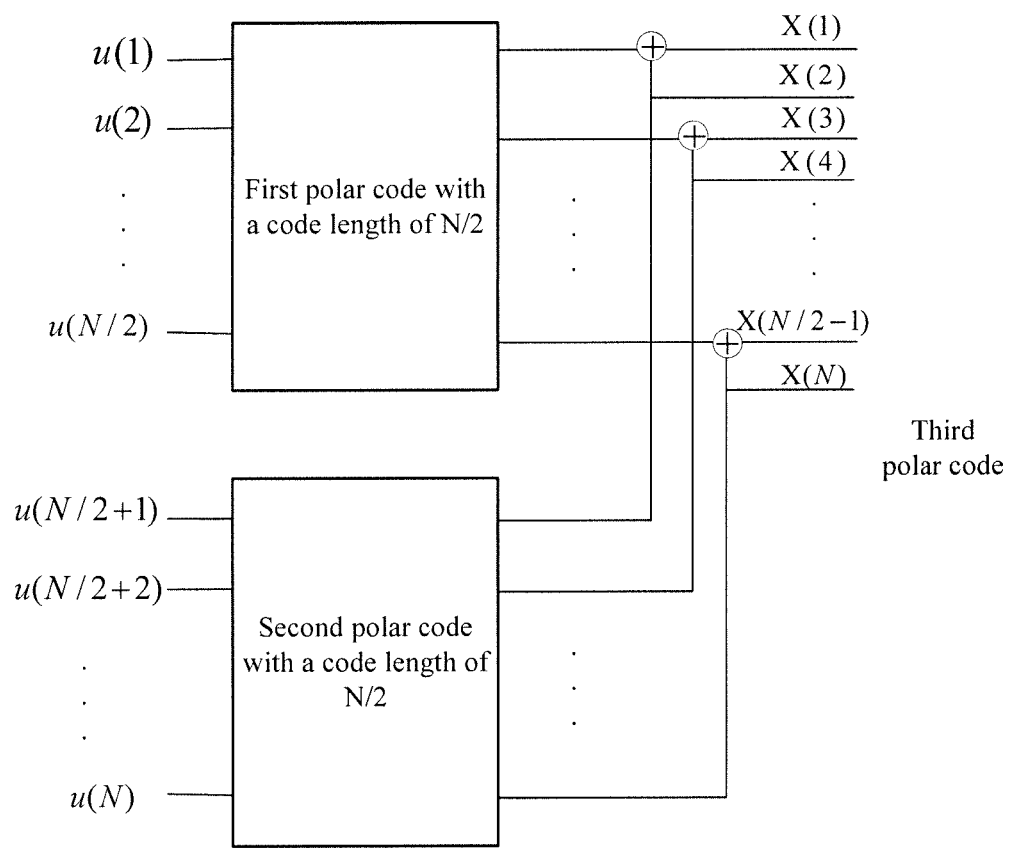
FIG. 3 is a schematic diagram of a recursive structure of a polar code according to an embodiment of the present invention.

The apparatus 60 can implement related steps and operations in the embodiments in FIG. 1 to FIG. 3. Therefore, to avoid repetition, no further details are provided.

Optionally, in an embodiment, the determining unit 5011 is further configured to determine a minimum code distance threshold $d_{th}$, where $d_{th}$ is greater than a minimum code distance $d_{cc}$ of an equivalent polar code whose code word length is N.

Optionally, in another embodiment, the determining unit 5011 is further configured to determine a generator matrix G of the equivalent polar code whose code word length is N;

determine a second information bit index set $A_2$ of the first polar code, where $A_2$ is an information bit index set of the first polar code; determine a third information bit index set $A_3$, and determine that bits corresponding to m positions with row weights of G less than $d_{th}$ in $A_3$ are $U_1$, where $A_3=A_2+N/2$, and m is an integer greater than or equal to 1; and determine that sequence numbers of m rows with row weights of G greater than or equal to $d_{th}$ and with row sequence numbers less than N/2 form $A_1$.

Optionally, the determining unit 5011 is further configured to determine that sequence numbers of m rows with row weights of G greater than or equal to $d_{th}$ and maximum, and with row sequence numbers less than N/2 form $A_1$.

Optionally, the determining unit 5011 is further configured to determine that bits corresponding to m positions with row weights of G less than $d_{th}$ and minimum in $A_3$ are $U_1$.

By using this solution, a code distance of a polar code transmitted for the second time can be improved (that is, the code distance increases), thereby improving HARQ performance.

Figure 7:
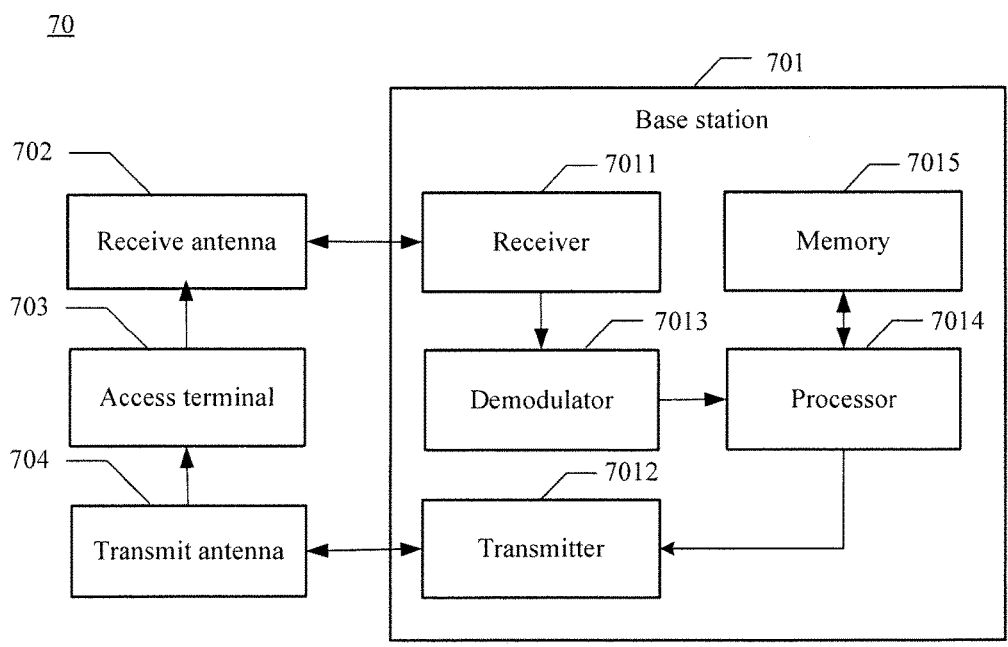
FIG. 7 is a schematic diagram of a logical structure of a wireless communications apparatus corresponding to a polar code retransmission method according to an embodiment of the present invention.

FIG. 7 is a schematic diagram of a system 70 that helps execute the foregoing polar code retransmission method in a wireless communications system. The system 70 includes a base station 701 (for example, an access point, an NB, or an eNB). The base station 701 has a receiver 7011 that receives a signal from one or more access terminals 703 by using multiple receive antennas 702, and a transmitter 7012 that transmits a signal to the one or more access terminals 703 by using a transmit antenna 704. Generally, a "receive antenna" and a "transmit antenna" may be integrated to constitute a transceiving antenna. The receiver 7011 can receive information from the receive antenna 702, and may be operationally associated to a demodulator 7013 that demodulates the received information. A demodulated symbol is analyzed by using a processor 7014. The processor 7014 is connected to a memory 7015. The memory 7015 is configured to store data to be sent to the access terminal 703 (or a different base station (which is not shown)) or data received from the access terminal 703 (or a different base station (which is not shown)), and/or any other proper information related to execution of actions and functions described in this specification.

The receiver 7011 is configured to receive a signal from, for example, a receive antenna (which is not shown), perform a typical action (for example, filtering, amplification, or down-conversion) on the received signal, and digitize an adjusted signal to obtain a sample.

The receiver 7011 may be, for example, a Minimum Mean Square Error (MMSE) receiver. The demodulator 7013 may be configured to demodulate received symbols and provide the received symbols for the processor 703 for channel estimation. The processor 7014 may be a processor that is dedicatedly configured to analyze information received by the receiver 7011 and/or generate information to be sent by the transmitter 7012, a processor that is configured to control one or more components of the base station, and/or a controller that is configured to analyze information received by the receiver 7011, generate information to be sent by the transmitter 7011, and control one or more components of the base station.

The memory 7015 is operationally coupled to the processor 7014, and stores the following data: data to be sent, received data, and any other proper information related to execution of actions and functions described in this specification. The memory 7015 may additionally store a protocol and/or an algorithm related to polar code processing.

It can be understood that a data storage apparatus (for example, the memory 7015) described in this specification may be a volatile memory or a nonvolatile memory, or may include both a volatile memory and a nonvolatile memory. It is exemplary rather than limitative that the nonvolatile memory may include: a ROM (Read-Only Memory, read-only memory), a PROM (Programmable ROM, programmable read-only memory), an EPROM (Erasable PROM, erasable programmable read-only memory), an EEPROM (Electrically EPROM, electrically erasable programmable read-only memory), or a flash memory. The volatile memory may include a RAM (Random Access Memory, random access memory), and is used as an external cache. It is exemplarily rather than limitatively noted that RAMs in many forms can be used, for example, an SRAM (Static RAM, static random access memory), a DRAM (Dynamic RAM, dynamic random access memory), an SDRAM (Synchronous DRAM, synchronous dynamic random access memory), a DDR SDRAM (Double Data Rate SDRAM, double data rate synchronous dynamic random access memory), an ESDRAM (Enhanced SDRAM, enhanced synchronous dynamic random access memory), an SLDRAM (Synchlink DRAM, synchlink dynamic random access memory), and a DR RAM (Direct Rambus RAM, Direct Rambus random access memory). The memory 7015 in the system and method described in this specification is intended to include, but is not limited to, these memories and any other memory of a proper type.

In an actual application, the memory 7015 is configured to store an instruction for performing the following operations:

encoding some information bits of a first polar code to obtain a second polar code, where the first polar code is a code word that is transmitted for the first time; and performing modulo-2 addition on the first polar code and the second polar code to obtain a third polar code.

The processor 7014 is configured to execute the instruction stored in the memory.

The transmitter 7012 is configured to send the third polar code provided by the processor 7014.

Optionally, the memory 7015 is further configured to store an instruction for performing the following operations: determining a first information bit set $U_1$, where $U_1$ is a subset of an information bit set $U_2$ of the first polar code; determining a first information bit index set $A_1$, where $A_1$ is an information bit index set of the second polar code; and encoding $U_1$ according to $A_1$ to obtain the second polar code, where both a code word length of the second polar code and a code word length of the first polar code are N/2, $N=2^n$, and n is an integer greater than 1.

Optionally, the memory 7015 is further configured to store an instruction for performing the following operation:

determining a minimum code distance threshold $d_{th}$, where $d_{th}$ is greater than a minimum code distance $d_{cc}$ of an equivalent polar code whose code word length is N.

Optionally, the memory 7015 is further configured to store an instruction for performing the following operations:

determining a generator matrix G of the equivalent polar code whose code word length is N; determining a second information bit index set $A_2$ of the first polar code, where $A_2$ is an information bit index set of the first polar code; determining a third information bit index set $A_3$, and determining that bits corresponding to m positions with row weights of G less than $d_{th}$ in $A_3$ are $U_1$, where $A_3=A_2+N/2$, and m is an integer greater than or equal to 1; and determining that sequence numbers of m rows with row weights of G greater than or equal to $d_{th}$ and with row sequence numbers less than N/2 form $A_1$.

Optionally, the memory 7015 is further configured to store an instruction for performing the following operation:

determining that bits corresponding to m positions with row weights of G less than $d_{th}$ and minimum in $A_3$ are $U_1$.

Optionally, the memory 7015 is further configured to store an instruction for performing the following operation:

determining that sequence numbers of m rows with row weights of G greater than or equal to $d_{th}$ and maximum, and with row sequence numbers less than N/2 form $A_1$.

By using this solution, a code distance of a polar code transmitted for the second time can be improved (that is, the code distance increases), thereby improving HARQ performance.

Figure 8:
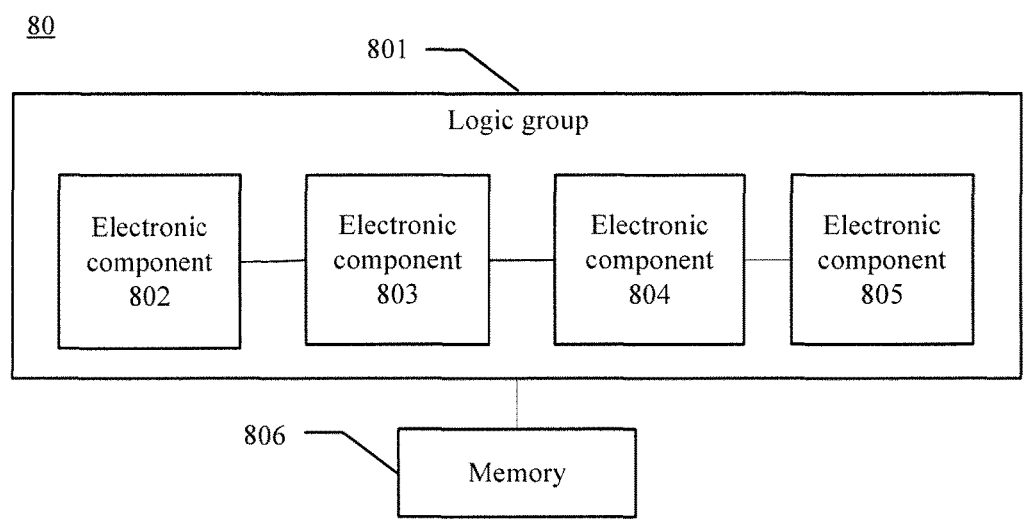
FIG. 8 is a schematic diagram of an exemplary system in which a polar code retransmission method can be used in a wireless communications environment.

Referring to FIG. 8, FIG. 8 shows a system 80 in which the foregoing method used for rate matching of a polar code can be used in a wireless communications environment. For example, the system 80 may at least partially reside in a base station. According to another example, the system 80 may at least partially reside in an access terminal. It should be understood that the system 80 may be represented as a functional block, which may represent a function implemented by a processor, software, or a combination thereof (for example, firmware). The system 80 includes a logic group 801 having electronic components that jointly perform an operation. For example, the logic group 801 may include an electronic component 802 that is configured to obtain a congruential sequence according to a code length of a target polar code, an electronic component 803 that is configured to perform sorting processing on the congruential sequence according to a preset rule to obtain a reference sequence, an electronic component 804 that is configured to determine a mapping function according to the congruential sequence and the reference sequence, and an electronic component 805 that is configured to interleave the target polar code according to the mapping function to generate interleaved output bits.

According to the foregoing solution, a first information bit set $U_1$ and a first information bit index set $A_1$ that are used to obtain a second polar code are determined according to a first polar code (a polar code that is transmitted for the first time); $U_1$ is encoded according to $A_1$ to obtain the second polar code; and then modulo-2 addition is performed on the second polar code and the first polar code to obtain a polar code that is transmitted for the second time. According to the foregoing solution, HARQ retransmission performance can be improved, thereby improving communication reliability. Moreover, the foregoing solution is applicable to a retransmission process of polar codes with various code lengths, and commonality and practicality are desirable.

In addition, the system 80 may include a memory 806. The memory 806 stores instructions used for performing functions related to the electronic components 802, 803, 804, and 805. Although it is shown that the electronic components 802, 803, 804, and 805 are outside the memory 806, it may be understood that one or more of the electronic components 802, 803, 804, or 805 may exist inside the memory 806.

Examples of one or more embodiments are described above. Certainly, it is impossible to describe all possible combinations of components or methods to describe the embodiments, but a person of ordinary skill in the art should know that the embodiments may be further combined and modified. Therefore, the embodiments described in this application are intended to include all changes, modifications, and variations falling within the spirit and the protection scope of the appended claims. In addition, for the term "include" used in the specification, meaning included in the term is similar to that included in the term "comprise", and is like that of the term "comprise" explained as a connecting term in the claims.

It may be clearly understood by a person skilled in the art that, for the purpose of convenient and brief description, division of the foregoing functional modules is used as an example for illustration. In an actual application, the foregoing functions can be allocated to different functional modules and implemented according to a requirement, that is, an inner structure of an apparatus is divided into different functional modules to implement all or some of the functions described above. For a detailed working process of the foregoing system, apparatus, and unit, reference may be made to a corresponding process in the foregoing method embodiments, and no further details are provided herein.

In the several embodiments provided in this application, it should be understood that the disclosed system, apparatus, and method may be implemented in other manners. For example, the described apparatus embodiment is merely exemplary. For example, the module or unit division is merely logical function division and may be other division in actual implementation. For example, multiple units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on multiple network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in the form of a software product. The computer software product is stored in a storage medium and includes several instructions for instructing a computer device (which may be a personal computer, a server, a network device, or the like) or a processor (processor) to perform all or a part of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A polar code retransmission method, comprising:
by a receiver that receives a signal from a receive antenna,
obtaining a plurality of code bits from the signal; and
performing, polar encoding on the plurality of code bits, to obtain a first polar code, wherein the first polar code comprises an information bit set $U_2$;
by a polar code encoder,
determining a first information bit set $U_1$, wherein $U_1$ is a subset of the information bit set $U_2$ of the first polar code;
determining, by the polar code encoder, a first information bit index set $A_1$, wherein $A_1$ is an information bit index set of a second polar code;
encoding, by the polar code encoder, $U_1$ according to $A_1$, to obtain the second polar code;
performing, by the polar code encoder, modulo-2 addition on the first polar code and the second polar code to obtain a third polar code;
receiving, a Hybrid Automatic Repeat reQuest (HARQ); and
in response to the HARQ, sending, by the polar code encoder, the third polar code; and
by a transmitter that transmits a signal using a transmit antenna transmitting the third polar code.

2. The polar code retransmission method according to claim 1, wherein before the determining a first information bit set $U_1$, the method further comprises:
determining, by the polar code encoder, a minimum code distance threshold $d_{th}$, wherein $d_{th}$ is greater than a minimum code distance $d_{cc}$ of an equivalent polar code whose code word length is N.

3. The polar code retransmission method according to claim 1, wherein the method further comprises:
determining, by the polar code encoder, a generator matrix G of the equivalent polar code whose code word length is N;
the determining a first information bit set $U_1$ comprises:
determining, by the polar code encoder, a second information bit index set $A_2$ of the first polar code, wherein $A_2$ is an information bit index set of the first polar code; and determining a third information bit index set $A_3$, and determining that bits corresponding tom positions with row weights of G less than $d_{th}$ in $A_3$ are $U_1$, wherein $A_3=A_2+N/2$, and m is an integer greater than or equal to 1; and
the determining a first information bit index set $A_1$ comprises:
determining, by the polar code encoder, that sequence numbers of m rows with row weights of G greater than or equal to $d_{th}$ and with row sequence numbers less than N/2 form $A_1$.

4. The polar code retransmission method according to claim 3, wherein the determining that bits corresponding to m positions with row weights of G less than $d_{th}$ in $A_3$ are $U_1$ comprises:
determining, by the polar code encoder, that bits corresponding to m positions with row weights of G less than $d_{th}$ and minimum in $A_3$ are $U_1$.

5. The polar code retransmission method according to claim 3, wherein the determining that sequence numbers of m rows with row weights of G greater than or equal to $d_{th}$ and with row sequence numbers less than N/2 form $A_1$ comprises:
determining, by the polar code encoder, that sequence numbers of m rows with row weights of G greater than or equal to $d_{th}$ and maximum, and with row sequence numbers less than N/2 form $A_1$.

6. A polar code retransmission apparatus, comprising:
a receive antenna to receive a signal;
a receiver to receive the signal from the receive antenna;
a memory to store instructions; and
a processor to execute the instructions to cause the polar code retransmission apparatus to:
perform polar encoding on a plurality of code bits included in the signal, to obtain a first polar code, wherein the first polar code comprises an information bit set $U_2$; determine a first information bit set $U_1$, wherein $U_1$ is a subset of the information bit set $U_2$ of the first polar code; determine a first information bit index set $A_1$, wherein $A_1$ is an information bit index set of a second polar code; encode $U_1$ according to $A_1$, to obtain the second polar code; and
perform modulo-2 addition on the first polar code and the second polar code to obtain a third polar code, and when a Hybrid Automatic Repeat reQuest (HARQ) is received, in response to the HARQ, output the third polar code; and
a transmitter to receive the third polar code from the processor and to output the third polar code as a to-be-retransmitted code word to a transmit antenna to transmit the to-be-transmitted code word.

7. The polar code retransmission apparatus according to claim 6, wherein:
the processor to execute the instructions to further cause the polar code retransmission apparatus to determine a minimum code distance threshold $d_{th}$ wherein $d_{th}$ is greater than a minimum code distance $d_{cc}$ of an equivalent polar code whose code word length is N.

8. The polar code retransmission apparatus according to claim 6, wherein:
the processor to execute the instructions to further cause the polar code retransmission apparatus to determine a generator matrix G of the equivalent polar code whose code word length is N; determine a second information bit index set $A_2$ of the first polar code, wherein $A_2$ is an information bit index set of the first polar code; determine a third information bit index set $A_3$, and determine that bits corresponding to m positions with row weights of G less than $d_{th}$ in $A_3$ are $U_1$, wherein $A_3=A_2+N/2$, and m is an integer greater than or equal to 1; and determine that sequence numbers of m rows with row weights of G greater than or equal to $d_{th}$ and with row sequence numbers less than N/2 form $A_1$.

9. The polar code retransmission apparatus according to claim 8, wherein:
the processor to execute the instructions to further cause the polar code retransmission apparatus to determine that bits corresponding to m positions with row weights of G less than $d_{th}$ and minimum in $A_3$ are $U_1$.

10. The polar code retransmission apparatus according to claim 8, wherein:
the processor to execute the instructions to further cause the polar code retransmission apparatus to determine that sequence numbers of m rows with row weights of G greater than or equal to $d_{th}$ and maximum, and with row sequence numbers less than N/2 form $A_1$.

11. A wireless communications apparatus, comprising:
a receiver to receive a signal using a receive antenna;
a memory, configured to store an instruction;
a processor, coupled with the memory, when the instruction stored in the memory is executed, wherein the processor is configured to:
   perform polar encoding on the plurality of code bits included in the signal, to obtain a first polar code, wherein the first polar code comprises an information bit set $U_z$;
   determine a first information bit set $U_1$, wherein $U_1$ is a subset of the information bit set $U_2$ of the first polar code;
   determine a first information bit index set $A_1$, wherein $A_1$ is an information bit index set of a second polar code;
   encode $U_1$ according to $A_1$, to obtain the second polar code; and
   perform modulo-2 addition on the first polar code and the second polar code to obtain a third polar code;
   receive a Hybrid Automatic Repeat reQuest (HARQ); and
   in response to the HARQ, output the third polar code; and
a transmitter configured to receive the third polar code from the processor and output the third polar code as a to-be-retransmitted code word to a transmit antenna to transmit the to-be-transmitted code word.

12. The wireless communications apparatus according to claim 11, wherein the memory is further configured to store an instruction for performing the following operation:
   determining a minimum code distance threshold $d_{th}$, wherein $d_{th}$ is greater than a minimum code distance $d_{cc}$ of an equivalent polar code whose code word length is N.

13. The wireless communications apparatus according to claim 11, wherein the memory is further configured to store an instruction for performing the following operations:
   determining a generator matrix G of the equivalent polar code whose code word length is N; determining a second information bit index set $A_2$ of the first polar code, wherein $A_2$ is an information bit index set of the first polar code; determining a third information bit index set $A_3$, and determining that bits corresponding to m positions with row weights of G less than $d_{th}$ in $A_3$ are $U_1$, wherein $A_3=A_2+N/2$, and m is an integer greater than or equal to 1; and determining that sequence numbers of m rows with row weights of G greater than or equal to $d_{th}$ and with row sequence numbers less than N/2 form $A_1$.

14. The wireless communications apparatus according to claim 13, wherein the memory is further configured to store an instruction for performing the following operation:
   determining that bits corresponding to m positions with row weights of G less than $d_{th}$ and minimum in $A_3$ are $U_1$.

15. The wireless communications apparatus according to claim 13, wherein the memory is further configured to store an instruction for performing the following operation:
   determining that sequence numbers of m rows with row weights of G greater than or equal to $d_{th}$ and maximum, and with row sequence numbers less than N/2 form $A_1$.

* * * * *

UNITED STATES PATENT AND TRADEMARK OFFICE
CERTIFICATE OF CORRECTION

PATENT NO. : 10,469,207 B2
APPLICATION NO. : 15/270411
DATED : November 5, 2019
INVENTOR(S) : Shen et al.

Page 1 of 1

It is certified that error appears in the above-identified patent and that said Letters Patent is hereby corrected as shown below:

In the Claims

Claim 3, Column 13, Line 49: "bits corresponding tom positions" should read -- bits corresponding to m positions --.

Signed and Sealed this
Twenty-third Day of June, 2020

Andrei Iancu
*Director of the United States Patent and Trademark Office*